United States Patent [19]

Schneider et al.

[11] Patent Number: 5,498,963

[45] Date of Patent: Mar. 12, 1996

[54] CORRECTION OF GEOMETRIC DISTORTION IN MRI PHASE AND PHASE DIFFERENCE IMAGES

[75] Inventors: Erika Schneider, Brookfield; Xiguang Zang, Waukesha; Michael R. Hartley, Pewaukee, all of Wis.

[73] Assignee: General Electric Company, Waukesha, Wis.

[21] Appl. No.: 286,365

[22] Filed: Aug. 5, 1994

[51] Int. Cl.$^6$ ........................................... G01V 3/14
[52] U.S. Cl. .......................................... 324/309; 324/307
[58] Field of Search ............................ 324/300, 307, 324/309, 312

[56] References Cited

U.S. PATENT DOCUMENTS

| | | | |
|---|---|---|---|
| 4,591,789 | 5/1986 | Glover et al. | 324/309 X |
| 4,672,320 | 6/1987 | Sekihara et al. | 324/309 X |
| 5,144,235 | 9/1992 | Glover et al. | 324/309 |
| 5,225,781 | 7/1993 | Glover et al. | 324/309 |
| 5,321,359 | 6/1994 | Schneider | 324/307 |

*Primary Examiner*—Sandra L. O'Shea
*Assistant Examiner*—Mack Haynes
*Attorney, Agent, or Firm*—Quarles & Brady

[57] ABSTRACT

In an MRI system NMR data is acquired and an image is reconstructed based on the net phase or phase difference of spins at locations in the imaged object. The phase or phase difference image is corrected for errors caused by non-linearities in one or more of the gradient fields. The phase or phase difference image values are weighted with spin signal magnitude image values and their locations warped to reflect gradient field non-linearity. The warped values are remapped to the image pixel locations and converted back to phase values by dividing by an average spin signal magnitude. In this manner geometric distortion caused by non-uniform magnetic field gradients are corrected without loss of quantitative phase or phase difference information.

14 Claims, 3 Drawing Sheets

CORRECTION OF GEOMETRIC DISTORTION IN MRI PHASE AND PHASE DIFFERENCE IMAGES

BACKGROUND OF THE INVENTION

The field of the invention is nuclear magnetic resonance imaging methods and systems. More particularly, the invention relates to the correction of geometric distortion in phase and phase difference MRI images due to gradient field non-linearities.

When a substance such as human tissue is subjected to a uniform magnetic field (polarizing field $B_o$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$. A signal is emitted by the excited spins, and after the excitation signal $B_1$ is terminated, this signal may be received and processed to form an image.

When utilizing these signals to produce images, magnetic field gradients ($G_x$, $G_y$, and $G_z$) are employed to locate the position of the excited spins. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

The reconstructed MRI image can be geometrically distorted due to a number of causes. The location of an object, or portions of the object, can be shifted due to changes in the local Larmor resonance frequency. Chemical shift artifacts caused by small differences in Larmor resonance frequency (e.g. fat and water spins), susceptibility differences between different tissues, and patient induced or polarizing magnetic field inhomogeneities are examples of sources for such shifting of position. Another source of distortion is stretching or contracting of the imaged object caused by non-linearity of one or more of the applied gradient magnetic fields. This distortion is referred to as "warping". Both distortions can be very substantial, however, in standard cylindrical magnets used for MR imaging and spectroscopy, warping distortion is usually much greater than the distortion due to shifting. This is particularly true when local gradient coils are employed in lieu of whole body gradient coils, since the field of view over which local coil gradient fields are linear is very limited. In addition to these "static" geometric distortions, time variant and spatially variant gradient eddy currents also contribute to both object shifting and image warping.

Techniques such as those disclosed in U.S. Pat. Nos. 4,591,789 and 4,672,320 have been developed to correct magnitude MRI images for these various types of geometric distortions. These correction methods work well when the data being corrected is continuous in nature, or does not need to be combined subsequently with other geometrically corrected image data. These correction methods thus work well for conventional magnitude images, but do not work when applied to image data based on the phase of the acquired NMR signals or the difference in phase between acquired NMR signals. The geometric correction methods are not applicable, therefore, to phase contrast MR angiography ("MRA") as described in U.S. Pat. Nos. 5,093,620; 5,101,156; 5,226,418; and 3-point Dixon acquisitions as disclosed in U.S. Pat. Nos. 5,144,235; 5,225,781 and 5,321,359; and they are not applicable to a number of other NMR methods relying on accurate phase information as described in U.S. Pat. Nos. 5,168,232; and 4,987,371.

SUMMARY OF THE INVENTION

The present invention is an extension of methods currently in use to correct MRI magnitude images for geometric errors due to gradient magnetic field non-linearities to correct MRI images containing signal phase or phase difference information. More specifically, a magnitude image is produced from the acquired MRI data (S) which is a measure of the number of spins at specific image pixel locations; the magnitude image is geometrically corrected (warped) to produce spatially accurate MRI data ($S_w$) which indicates the actual location and density of the spins; a phase image is also produced from the acquired MRI data which indicates the average phase ($\phi$) or phase difference ($\Delta\phi$) of the spins within the voxels represented by the specific pixel locations; the phase values are unwrapped ($\phi_u$); the unwrapped phase values ($\phi_u$) are multiplied by their corresponding warped magnitude values ($S_w$) to produce magnitude-weighted phase values ($\phi_u*S_w$) at the actual spin locations; a magnitude-weighted phase value is then calculated at each specific image pixel location by combining a plurality of the nearby magnitude-weighted phase values ($\phi_u*S_w$); and a corrected phase value ($\phi_c$) is calculated at each pixel location by dividing the corresponding magnitude-weighted phase value by an average magnitude value ($S_{AV}$).

A general object of the invention is to accurately correct MRI phase and phase difference data for spatial location errors caused by non-linear gradient fields. Both magnitude data and phase data are warped, or remapped, to correctly indicate geometric position of the spins producing the NMR signals. The phase data is mapped back to the image pixel locations by weighting each phase value with its corresponding magnitude value prior to combination at the pixel locations, and then unweighting the resulting phase value by dividing by an average magnitude value. By weighting the phase data with magnitude data a quantitative measure of the number of spins at each different phase value is maintained during the combining or interpolation step required to map the warped phase values back to the image pixel locations.

BRIEF DESCRIPTION OF THE DRAWINGS

FIG. 4 is a graphic representation of how acquired NMR phase ($\phi$) and phase difference ($\Delta\phi$) values are unwrapped to indicate values outside the $2\pi$ radian range of the acquired NMR signals.

DESCRIPTION OF THE PREFERRED EMBODIMENT

Figure 1:
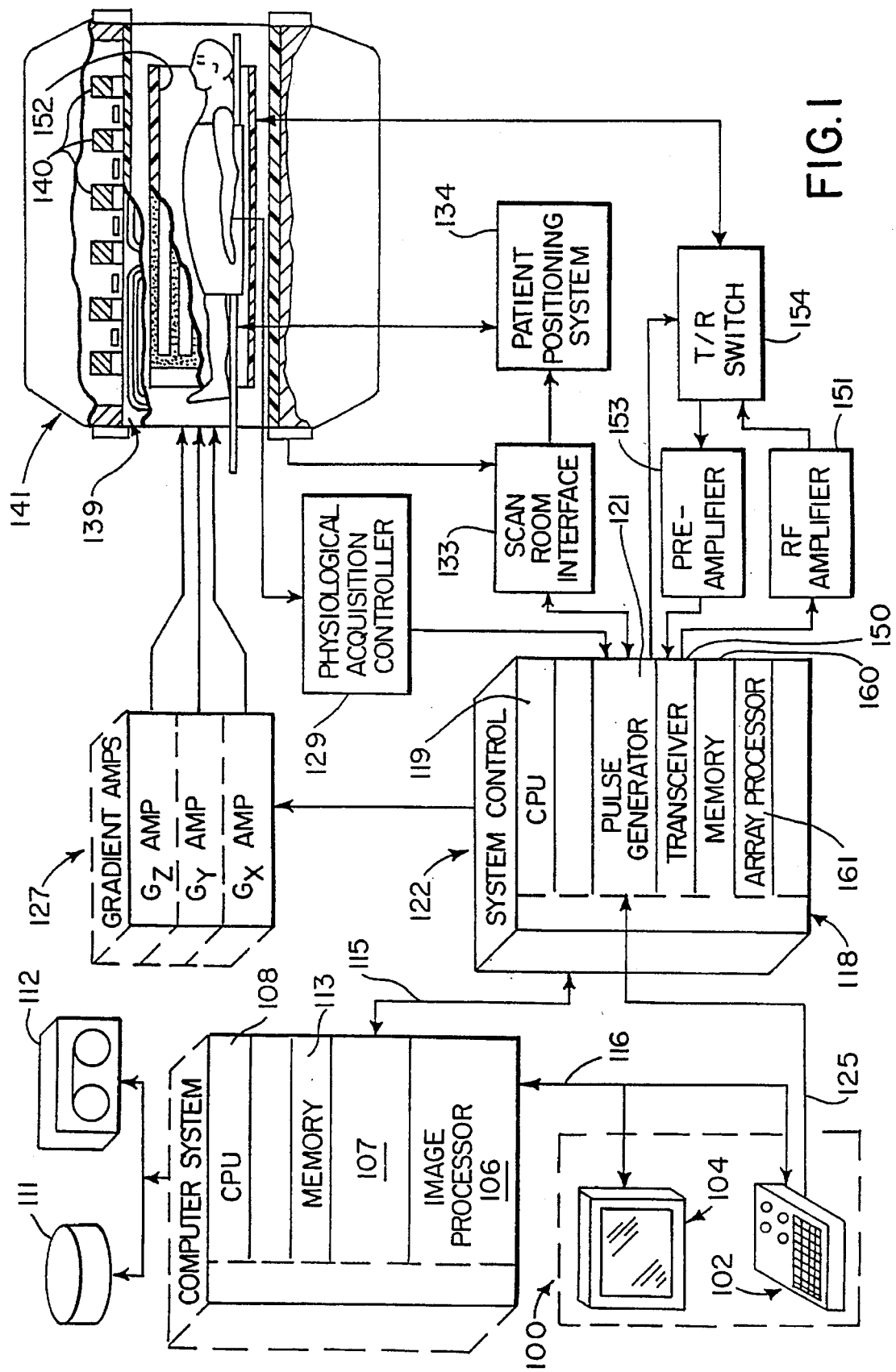
FIG. 1 is a block diagram of an MRI system which employs the present invention.

Referring first to FIG. 1, there is shown the major components of a preferred MRI system which incorporates the present invention. The operation of the system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicates the timing, strength and shape of the RF pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. And finally, the pulse generator module 121 connects to a scan room interface circuit 133 which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier system 127 comprised of $G_x$, $G_y$ and $G_z$ amplifiers. Each gradient amplifier excites a corresponding gradient coil in an assembly generally designated 139 to produce the magnetic field gradients used for position encoding acquired signals. The gradient coil assembly 139 forms part of a magnet assembly 141 which includes a polarizing magnet 140 and a whole-body RF coil 152. A transceiver module 150 in the system control 122 produces pulses which are amplified by an RF amplifier 151 and coupled to the RF coil 152 by a transmit/receive switch 154. The resulting signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a head coil or surface coil) to be used in either the transmit or receive mode.

The NMR signals picked up by the RF coil 152 are digitized by the transceiver module 150 and transferred to a memory module 160 in the system control 122. When the scan is completed and an entire array of data has been acquired in the memory module 160, an array processor 161 operates to transform the data into an array of image data. This image data is conveyed through the serial link 115 to the computer system 107 where it is stored in the disk memory 111. In response to commands received from the operator console 100, this image data may be archived on external drive 112, or it may be further processed by the image processor 106 as will be described in more detail below and conveyed to the operator console 100 and presented on the display 104.

For a more detailed description of the transceiver 150, reference is made to U.S. Pat. Nos. 4,952,877 and 4,992,736 which are incorporated herein by reference.

Figure 2:
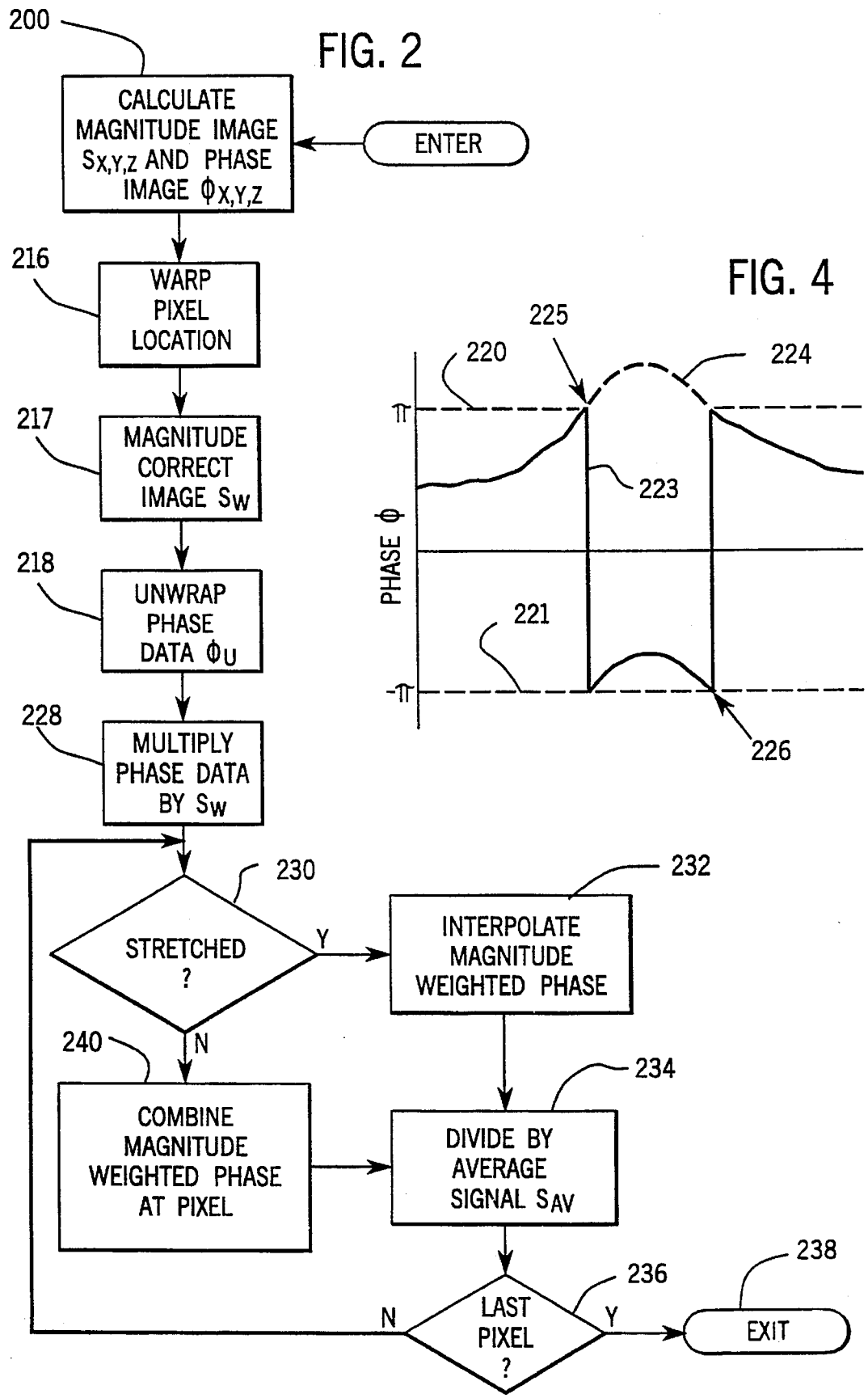
FIG. 2 is a flow chart of a program executed by the MRI system of FIG. 1 to carry out the preferred embodiment of the present invention.

The present invention is implemented under the direction of a program which is illustrated in FIG. 2 to correct image data which has been acquired during a scan as described above. At each pixel location in the reconstructed image is data that indicates the quadrature (I and Q) components of the signal at that location. A magnitude image can be produced from this image data as indicated at process block 200 by performing the following calculation at each pixel location:

$$S(x,y,z) = \sqrt{I^2 + Q^2} \quad (1)$$

Figure 3:
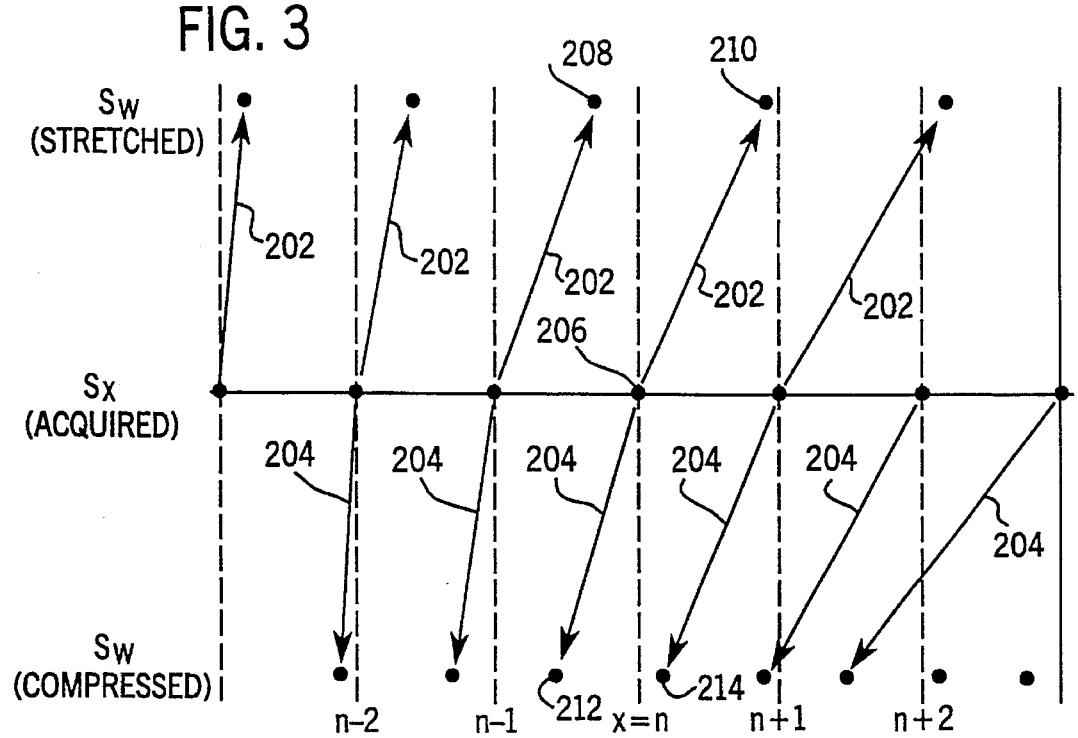
FIG. 3 is a graphic representation of how NMR image magnitude values are warped along one axis to correct for non-linearities in the gradient field along that axis.

Due to non-uniformity of the field gradients $G_x(x,y,z)$, $G_y(x,y,z)$, $G_z(x,y,z)$ in the region of this voxel, this magnitude image pixel is geometrically misplaced and actually represents the magnitude of the signal from a nearby location. As illustrated in FIG. 3 for one axis (x-axis) in the region around pixel location x=n, the uniformly spaced acquired values $S_x$ may in fact represent the signal values that are "stretched out" along the x-axis as indicated by arrows 202, or they may be "compressed" along the x-axis as indicated by arrows 204. In the first case the $G_x$ field gradient is greater than that required to remain constant in this region of the image, and in the second case the $G_x$ field gradient is less than desired.

As described in U.S. Pat. No. 4,591,789 issued May 27, 1986 and entitled "Method For Correcting Image Distortion Due To Gradient Nonuniformity", the displacement of the acquired signal $S(x,y,z)$ may be corrected in a two step process. As indicated at process block 217, the first step a signal magnification/minification factor $W(x,y,z)$ is calculated for each acquired signal $S(x,y,z)$ to correct for deviations from nominal voxel dimensions owing to non-uniformity of the $G_x(x,y,z)$, $G_y(x,y,z)$ and $G_z(x,y,z)$ gradients. Each magnetic field gradient can be modeled by $$G'_\alpha(x,y,z) = G_\alpha(0,0,0)[1-\epsilon_\alpha(x,y,z)] \quad (2)$$

in which $\alpha$ is one of x, y, and z, $G'_\alpha(x,y,z)$ is the actual (uncorrected) gradient, $G_\alpha(0,0,0)$ is the gradient at the isocenter, $\epsilon_\alpha(x,y,z)$ is the error term by which the gradient at (x,y,z) departs from the gradient at the isocenter.

The actual gradient $F_\alpha$ can be expressed in normalized units by dividing both sides of equation (2) by $G_\alpha(0,0,0)$ to yield $$F_\alpha(x,y,z) = 1 - \epsilon_\alpha(x,y,z) \quad (3)$$

The corrected gradient, $G_\alpha^c$, is given by $$G_\alpha^c(x,y,z) = \frac{G_\alpha'(x,y,z)}{1 - \epsilon_\alpha(x,y,z)}, \quad (4)$$

As shown in process block 216, the warping factor $W(x,y,z)$ to remap (displace) the pixel location and compensate for gradient non-uniformity is determined by modeling this distortion and calculating the actual pixel location based on $G'_\alpha$. The actual field gradient $G'_\alpha$ for a particular gradient coil can be determined by measurement, or it can be defined by the spherical harmonic expansion for the field gradient produced by the coil based on its geometric shape and the currents flowing therein. The spherical harmonic expansion for a number of exemplary gradient coil structures are defined in the above-cited U.S. Pat. No. 4,591,789 which is incorporated herein by reference.

In addition to monitoring a different spatial location, non-uniform gradients can cause the voxel dimensions to be non-ideal. As a result of the non-theoretical voxel size, a greater or lesser number of spins are monitored and commensurately greater or lesser NMR signal results. A correction for inconsistent voxel dimensions owing to gradient non-uniformity is disclosed in U.S. Pat. No. 4,591,789 for magnitude image pixel values. This magnification/minification factor calculated at process block 217 may be computed by $$W(x,y,z) = \frac{1}{1 - \epsilon(x,y,z)} \quad (5)$$

and is applied prior to resampling the pixel values.

Referring to FIG. 3, for example, the result of this warping step is to relocate the acquired signal $S(x,y,z)$ along the x-axis to produce warped signal samples $S_w$. This remapping may result in a stretching of the signals along the x-axis or a compression of the signals depending on how the gradient fields vary from linearity.

The second step required to produce a corrected magnitude image from the warped signal $S_w$ is to "resample" the warped signal at the pixel locations. This is accomplished by interpolation of the warped magnitude signal samples $S_w$. Referring to FIG. 3 for example, if the samples are stretched, the magnitude of the pixel 206 at x=n is determined by interpolating between the warped signal samples at 208 and 210. Similarly, if the samples are compressed, the magnitude of the pixel 206 is determined by interpolating between warped samples 212 and 214. In the preferred embodiment this interpolation is performed by fitting a cubic spline through the four closest warped signal samples and then sampling this curve at the desired pixel location. This step reassociates signal intensity with pixel location and provides some noise filtering of the signal without loosing important anatomical detail at the juncture of different tissue types.

When this correction method is used, an accurate magnitude image is produced. However, the phase, or phase difference, information is not preserved and the method cannot be used to produce images based on an accurate indication of phase or phase difference value at each pixel location. However, to practice the present invention the first step (i.e. "warping") in the above-described signal magnitude correction process is employed as indicated at process block 217 in FIG. 2 and results in an array of corrected, warped signal magnitude samples $S_w$. These will be used as described below to calculate signal phase at each pixel location.

To understand how to maintain quantitative phase and phase difference pixel values, it is useful to examine the manner in which both magnitude and phase information is accumulated. Pixel magnitude values are the sum of the individual magnitude value of each spin, $S_i$, and can be represented by $$S(x,y,z) = \sum_{i=1}^{n(x,y,z)} S_i(x,y,z) \quad (6)$$

where $n(x,y,z)$ is the number of spins in the voxel at location $(x,y,z)$. Since the individual spin magnitude values depend only on pulse sequence and tissue/substance $(T_1, T_2)$ characteristics, this results in counting the number of spins of each tissue/substance:

$$S(x,y,z) = \sum_{j=1}^{m} n_m(x,y,z) S_m(x,y,z) \quad (7)$$

where m is the number of substances/tissues in the voxel. For a uniform material $S(x,y,z)=n(x,y,z) S_i(x,y,z)$. Pixel phase values also accumulate additively, $$\phi(x,y,z) = \sum_{i=1}^{n(x,y,z)} \phi_i(x,y,z)$$

however, the individual phase $\phi_i(x,y,z)$ can be any value. Thus, the summation results in an average net phase for all the spins contained in the voxel. If the voxel dimension is changed the number of spins contained therein change, thus the magnitude value must change proportional with voxel volume. Voxel phase values will not be as dramatically affected since they represent the net average phase. Thus magnification/minification of phase value is not linearly dependent upon gradient non-uniformity.

The phase information to be corrected is an array of values $\phi(x,y,z)$ representing the phase or phase difference at the image pixel locations. In the following discussion references to "phase," or "phase information" encompasses both the phase of an NMR signal and the phase difference information derived from two or more NMR signals. Just as the warped signal magnitudes $S_w(x,y,z)$ must be relocated to reflect gradient field non-linearities, so must the signal phase $\phi(x,y,z)$. Before this is done, however, the phase values must be "unwrapped" as indicated at process block 218. This unwrapping step is illustrated in FIG. 4 for signals acquired at pixels along the x-axis. Phase is determined by the I and Q signal components at each pixel location as follows:

$$\phi(x,y,z) = \tan^{-1} Q/I.$$

This trigonometric relationship can only indicate phase over a range of $-\pi$ to $+\pi$ or 0 to $2\pi$ radians as indicated by dashed lines 220 and 221. In the example shown, the acquired values will reside in this $2\pi$ range as indicated by solid line 223, even though the actual phase follows the dotted line 224 above $\pi$ radians for an interval. The unwrapping step detects the wrap around points 225 and 226 in the phase data and either adds or subtracts $2\pi$ radians to the measured value as appropriate. For a detailed description of how this is performed, reference is made to U.S. Pat. No. 5,144,235, issued Sep. 1, 1992, entitled "Method Of Decomposing NMR Images By Chemical Species" which is incorporated herein by reference.

Figure 5:
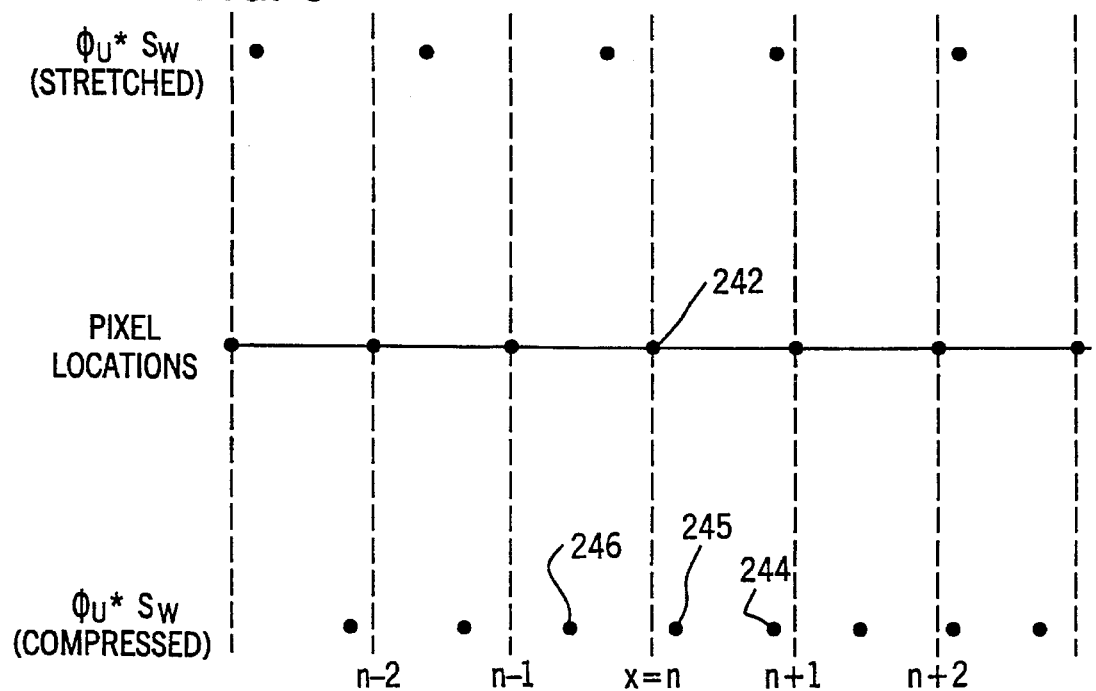
FIG. 5 is a graphic representation of how the unwrapped phase or phase difference values $\phi_u$ are corrected for gradient non-linearities at each pixel location along an axis.

The next step as indicated in FIG. 2 by process block 228 is to weight each unwrapped phase value $\phi_u$ by an amount determined by its corresponding warped signal magnitude $S_w$. This weighting factor is determined in the preferred embodiment by first multiplying each phase value $\phi_u$ by its corresponding warped signal magnitude $S_w$. Later, as will be described below, the result is divided by an average warped magnitude signal $S_{av}$. Each product $\phi_u * S_w$ has a pixel position determined by the remapping operation at process block 216. As shown in FIG. 5 for the x axis, these positions may be stretched or compressed as discussed above. These warped magnitude-weighted phase values are then used to calculate the correct phase at each pixel location, one pixel at a time. In this manner the quantitative nature of the phase or phase information is retained.

As shown in FIG. 2, the calculation of the phase value at each pixel location is done differently for stretched data and compressed data. When the data is stretched by the warping operation, there are fewer warped data samples $\phi_u * S_w$ per pixel location. This is determined at decision block 230 and a magnitude-weighted interpolation is performed as indicated at process block 232. This operation is similar to that described above for the magnitude data in that a cubic spline curve is fit to the four data points $\phi_u * S_w$ closest to the desired pixel location. The quantitatively accurate phase or phase difference value at the pixel location is then determined directly from the equation for this cubic spline. As indicated at process block 234 the unweighted, corrected phase value $\phi_c$ at the pixel location is then calculated by dividing by an average signal magnitude $S_{av}$. If further pixel values are to be calculated, as determined at decision block 236, the system loops back to decision block 230 to determine if the warped data is stretched or compressed around the next pixel location. Otherwise, corrected phase values $\phi_c$ at all pixel locations have been calculated and the program terminates at 238.

If the weighted phase data $\phi_u * S_w$ is compressed about the pixel location, as determined at decision block 230, the magnitude-weighted phase at that pixel location is calculated at process block 240. In this case the desired value is the sum of all the data points $\phi_u * S_w$ which fall within one pixel spacing of the desired pixel location. Each such data point $\phi_u * S_w$ is weighted, however, by its distance (d) from the pixel location as a fraction of the spacing between pixels (L):

$$\frac{(L-d)}{L} \phi_u * S_w.$$

As illustrated in FIG. 5 for the value 242 at pixel location x=n, the three magnitude-weighted phase values 244, 245 and 246 are summed after each is further weighted as a function of its distance from x=n. As a result, the value 245 contributes heavily to the sum, the value 246 less, and the value 244 the least. As when interpolation is used at process block 232, the magnitude-weighted phase at the pixel location is then converted to the corrected phase value $\phi_c$ by dividing by the average signal magnitude $S_{av}$ as part of the weighting process.

The average signal magnitude $S_{av}$ is determined in the preferred embodiment by averaging all the acquired image magnitude values $S(x,y,z)$ calculated at process block 200 after filtering out all the values that fail to exceed a threshold value. The threshold value is set to exclude data from outside the boundaries of the patient being image.

These methods are equally applicable to gradient fields which are non-linear by design. Such fields can be experimentally measured or mathematically modelled. Images acquired using such gradient fields can then be corrected using the present invention.

We claim:

1. A method for correcting phase information in NMR data acquired with a non-linear gradient magnetic field, the steps comprising:

a) acquiring the NMR data in the presence of the non-linear gradient magnetic field;

b) reconstructing an NMR image using the acquired NMR data, the NMR image including data located at discrete pixel locations extending along an axis defined by the direction of the non-linear gradient magnetic field;

c) producing a magnitude image from the NMR image indicating spin signal magnitude at the discrete pixel locations;

d) producing a phase image from the NMR image indicating spin phase information at the discrete pixel locations;

e) producing a magnitude-weighted phase image comprised of values formed by multiplying a factor determined by the spin signal magnitude at each discrete pixel location by the corresponding phase information;

f) producing a warped magnitude-weighted phase image in which the values therein are displaced from the discrete pixel locations to account for the geometric distortion caused by the non-linearity of the non-linear gradient magnetic field; and g) remapping the warped magnitude-weighted phase image by combining values therein to calculate phase values at each discrete pixel location.

2. The method as recited in claim 1 in which the phase image produced in step d) indicates the net spin phase difference between the NMR image and a second NMR image.

3. The method as recited in claim 1 in which the NMR image data at each discrete pixel location includes two quadrature components (I and Q), and the spin signal magnitude (S) at each discrete pixel location is calculated in step c) according to the formula $$S = \sqrt{I^2 + Q^2}.$$

4. The method as recited in claim 3 in which the net spin phase ($\phi$) at each discrete pixel location is calculated in step d) according to the formula $$\phi = \tan^{-1} Q/I.$$

5. The method as recited in claim 1 in which the values in the phase image are unwrapped to indicate net spin phase greater than a range of $2\pi$ radians.

6. The method as recited in claim 1 in which the combining of values in the remapping step g) is interpolation between said values.

7. The method as recited in claim 6 in which the interpolation includes fitting an equation to warped magnitude-weighted phase image values and calculating the value of said equation at a discrete pixel location.

8. The method as recited in claim 1 in which the combining of values in the remapping step g) is the summation of values within a preselected distance from the discrete pixel location.

9. The method as recited in claim 8 in which the preselected distance is the distance between discrete pixels.

10. The method as recited in claim 9 in which a portion of each value is summed, and the portion is determined by the distance (d) of the value location from the discrete pixel location and the distance between discrete pixel locations (L) in accordance with the formula portion=$(L-d)/L$.

11. The method as recited in claim 1 in which the factor in step e) is the spin signal magnitude and the calculation of phase values in step g) includes dividing by an average spin signal magnitude value.

12. The method as recited in claim 11 in which the average spin signal magnitude value is calculated after the signal magnitudes below a preset threshold value are excluded.

13. The method as recited in claim 1 in which the magnitude image is corrected for deviations from nominal voxel dimensions due to the non-linearity of the non-linear gradient magnetic field.

14. The method as recited in claim 2 in which the values in the phase image are unwrapped to a net spin phase difference greater than $2\pi$.

* * * * *